(12) United States Patent
Sato et al.

(10) Patent No.: US 10,280,522 B2
(45) Date of Patent: May 7, 2019

(54) ARTIFICIAL-PHOTOSYNTHESIS ARRAY

(71) Applicants: FUJIFILM Corporation, Tokyo (JP); Japan Technological Research Assocation of Artificial Photosynthetic Chemical Process, Tokyo (JP); THE UNIVERSITY OF TOKYO, Tokyo (JP)

(72) Inventors: Naotoshi Sato, Kashiwa (JP); Kazunari Domen, Tokyo (JP); Jiro Tsukahara, Kashiwa (JP)

(73) Assignees: FUJIFILM Corporation, Tokyo (JP); Japan Technological Research Association of Artificial Photosynthetic Chemical Process, Tokyo (JP); The University of Tokyo, Tokyo (JP)

(*) Notice: Subject to any disclaimer, the term of this patent is extended or adjusted under 35 U.S.C. 154(b) by 232 days.

(21) Appl. No.: 15/178,641

(22) Filed: Jun. 10, 2016

(65) Prior Publication Data

US 2016/0281244 A1 Sep. 29, 2016

Related U.S. Application Data

(63) Continuation of application No. PCT/JP2014/080943, filed on Nov. 21, 2014.

(30) Foreign Application Priority Data

Dec. 13, 2013 (JP) .................................. 2013-258305

(51) Int. Cl.
*C25B 1/10* (2006.01)
*C25B 1/04* (2006.01)
(Continued)

(52) U.S. Cl.
CPC ................ *C25B 1/10* (2013.01); *C25B 1/003* (2013.01); *C25B 1/04* (2013.01); *C25B 9/08* (2013.01);
(Continued)

(58) Field of Classification Search
CPC ...................................................... C25B 1/003
(Continued)

(56) References Cited

U.S. PATENT DOCUMENTS

| | | | | |
|---|---|---|---|---|
| 4,021,323 A | * | 5/1977 | Kilby ...................... | C25B 1/003 136/246 |
| 4,793,910 A | * | 12/1988 | Smotkin .................. | C25B 1/003 204/268 |

(Continued)

FOREIGN PATENT DOCUMENTS

| | | | | |
|---|---|---|---|---|
| GB | 2414243 A | * | 11/2005 | ............. C25B 1/003 |
| JP | 2012-41623 A | | 3/2012 | |
| JP | 2012-177160 A | | 9/2012 | |

OTHER PUBLICATIONS

International Preliminary Report on Patentability and the Written Opinion of the International Searching Authority (Forms PCT/IB/338, PCT/IB/373, PCT/ISA/237) dated Jun. 23, 2016, for International Application No. PCT/JP2014/080943.
(Continued)

*Primary Examiner* — Harry D Wilkins, III
(74) *Attorney, Agent, or Firm* — Birch, Stewart, Kolasch & Birch, LLP

(57) ABSTRACT

Provided is an artificial-photosynthesis array configured of artificial-photosynthesis modules which have been arranged in one or more rows and which receive light and decompose a supplied aqueous electrolyte solution to thereby obtain hydrogen gas and oxygen gas. The artificial-photosynthesis modules each includes an electrolytic chamber for hydrogen
(Continued)

where hydrogen gas is generated and an electrolytic chamber for oxygen where oxygen gas is generated, the chambers being isolated from each other. The electrolytic chambers for hydrogen and electrolytic chambers for oxygen of the artificial-photosynthesis modules are alternately connected so that the electrolytic chamber for hydrogen of each artificial-photosynthesis module is connected to the electrolytic chamber for oxygen of another module and the electrolytic chamber for oxygen of each artificial-photosynthesis module is connected to the electrolytic chamber for hydrogen of another module.

20 Claims, 9 Drawing Sheets

(51) Int. Cl.

| | | |
|---|---|---|
| C25B 9/08 | (2006.01) | |
| C25B 15/08 | (2006.01) | |
| H01L 31/0749 | (2012.01) | |
| C25B 15/00 | (2006.01) | |
| C25B 1/00 | (2006.01) | |
| C25B 11/04 | (2006.01) | |
| H01L 31/032 | (2006.01) | |
| H01L 31/042 | (2014.01) | |

(52) U.S. Cl.
CPC .......... *C25B 11/0473* (2013.01); *C25B 15/00* (2013.01); *C25B 15/08* (2013.01); *H01L 31/0322* (2013.01); *H01L 31/0326* (2013.01); *H01L 31/042* (2013.01); *H01L 31/0749* (2013.01); *Y02E 10/541* (2013.01); *Y02E 60/368* (2013.01); *Y02P 70/521* (2015.11)

(58) Field of Classification Search
USPC .......................................... 205/340; 204/248
See application file for complete search history.

(56) References Cited

U.S. PATENT DOCUMENTS

| | | | | |
|---|---|---|---|---|
| 6,198,037 | B1* | 3/2001 | Nakata | C25B 1/003 136/246 |
| 2005/0183962 | A1* | 8/2005 | Oakes | C25B 1/04 205/340 |
| 2005/0205128 | A1* | 9/2005 | Deng | C25B 1/003 136/256 |
| 2005/0211290 | A1* | 9/2005 | Deng | C25B 1/003 136/252 |
| 2008/0223439 | A1* | 9/2008 | Deng | C25B 1/003 136/258 |
| 2011/0174610 | A1* | 7/2011 | Nomura | C01B 3/042 204/252 |
| 2011/0214996 | A1* | 9/2011 | Yoshida | C01B 3/04 205/633 |
| 2011/0315545 | A1* | 12/2011 | Kuroha | C01B 3/042 204/242 |
| 2012/0080310 | A1* | 4/2012 | Nomura | C01B 3/042 204/263 |
| 2012/0125780 | A1* | 5/2012 | Oakes | C25B 1/003 205/340 |
| 2012/0216854 | A1* | 8/2012 | Chidsey | C25B 1/003 136/248 |
| 2013/0015076 | A1* | 1/2013 | Yoshida | C25B 1/02 205/340 |
| 2013/0037414 | A1* | 2/2013 | Obenland | B01J 23/462 205/340 |
| 2013/0068296 | A1* | 3/2013 | Yoshida | C01B 13/0207 136/256 |
| 2013/0092549 | A1* | 4/2013 | Spurgeon | H01L 31/0586 205/340 |
| 2013/0105305 | A1* | 5/2013 | Yang | C25B 11/035 204/242 |
| 2013/0180862 | A1* | 7/2013 | Yoshida | C25B 1/003 205/340 |
| 2014/0021034 | A1* | 1/2014 | Lewis | H01G 9/20 204/157.15 |
| 2015/0259810 | A1* | 9/2015 | Lewis | C25B 11/0447 204/291 |
| 2016/0017506 | A1* | 1/2016 | Sato | C25B 1/10 204/252 |

OTHER PUBLICATIONS

International Search Report for PCT/JP2014/080943 (PCT/ISA/210) dated Feb. 17, 2015.
Written Opinion of the International Searching Authority for PCT/JP2014/080943 (PCT/ISA/237) dated Feb. 17, 2015.

\* cited by examiner

ARTIFICIAL-PHOTOSYNTHESIS ARRAY

CROSS-REFERENCE TO RELATED APPLICATIONS

This application is a Continuation of PCT International Application No. PCT/JP2014/080943 filed on Nov. 21, 2014, which claims priority under 35 U.S.C. § 119(a) to Japanese Patent Application No. 2013-258305 filed on Dec. 13, 2013. The above application is hereby expressly incorporated by reference, in its entirety, into the present application.

BACKGROUND OF THE INVENTION

1. Field of the Invention

The present invention relates to an artificial-photosynthesis array that has a plurality of artificial-photosynthesis modules that receive light to decompose water and manufacture hydrogen and oxygen, and particularly, to an artificial-photosynthesis array that can keep an ion concentration or pH value in water constant.

2. Description of the Related Art

In the related art, as one form of using solar light energy that is a renewable energy, there are suggested hydrogen manufacturing apparatuses that utilize electrons and positive holes obtained by photoelectric conversion for a decomposition reaction of water, using a photoelectric conversion material used for solar batteries, and thereby manufacture hydrogen used for fuel cells or the like (for example, refer to JP2012-177160A and JP2012-41623A).

In the hydrogen manufacturing apparatus disclosed in JP2012-177160A, a photoelectric conversion part or a solar battery in which two or more pn junctions that generate an electromotive force if solar light enters are connected in series is provided, an electrolytic solution chamber is provided on a lower side of the photoelectric conversion part or the solar battery opposite to a light-receiving surface that receives solar light on an upper side of the photoelectric conversion part, and the inside of an electrolytic chamber is divided by the ion-conducting partition wall or a diaphragm. In JP2012-177160A, water is electrolyzed within the electrolytic solution chamber by the electrical energy generated in the photoelectric conversion part or the solar battery by the reception of solar light, and thereby hydrogen gas and oxygen gas are generated.

In the hydrogen manufacturing apparatus disclosed in JP2012-177160A, the orientation of the light-receiving surface with respect to solar light can be adjusted. Thus, the amount of incident light to be photoelectrically converted can be increased, and hydrogen generation efficiency is not lowered.

Additionally, a water electrolysis apparatus disclosed in JP2012-41623A has a light-receiving surface and a rear surface thereof, and includes a photoelectric conversion part in which a potential difference is caused between the light-receiving surface and the rear surface by receiving light, a first electrode for electrolysis that is provided on the rear surface side of the photoelectric conversion part and is electrically connected to the rear surface of the photoelectric conversion part, a second electrode for electrolysis that is provided on the rear surface side of the photoelectric conversion part and is electrically connected to the light-receiving surface of the photoelectric conversion part, and a flow path provided so that water flows therethrough. The first electrode for electrolysis and the second electrode for electrolysis are provided so as to be immersible in the water within the flow path, and are provided so as to electrolyze water with an electromotive force generated by the photoelectric conversion part receiving light and thereby generate hydrogen gas and oxygen gas, respectively. Either the first electrode for electrolysis or the second electrode for electrolysis is a hydrogen generating part, and the other is an oxygen generating part.

The flow path is constituted of a first flow path in which the first electrode for electrolysis is formed within the flow path, a second flow path in which the second electrode for electrolysis is formed within the flow path, and a communication flow path, and a partition wall is provided so as to partition off the first flow path from the second flow path. There are a plurality of first flow paths and a plurality of second flow paths, and these flow paths are provided alternately and parallel to each other, and a first flow path and a second flow path adjacent to each other are able to communicate with each other via the communication flow path.

SUMMARY OF THE INVENTION

In the apparatuses that decompose water into hydrogen gas and oxygen gas by optical irradiation as in the above-described JP2012-177160A and JP2012-41623A, it is necessary to partition off the hydrogen generating part from the oxygen generating part physically in a case where hydrogen gas and oxygen gas are separated from each other and generated. Meanwhile, if water continues being decomposed, a difference is caused in ion concentration or pH value in water between the hydrogen generating part and the oxygen generating part, and water decomposition capability degrades. As a countermeasure against this difference, a method of keeping the ion concentration or pH constant by providing an ion exchange membrane of, for example, NAFION (registered trademark) manufactured by E. I. du Pont de Nemours& Co, as a partition wall, is known. However, in a case where a space is partitioned off by such a membrane, there is a problem that it is difficult to separate the hydrogen gas and the oxygen gas completely to prevent mixture of the hydrogen gas and the oxygen gas, and it is difficult to keep the ion concentration or pH value in water constant.

An object of the invention is to solve the problem based on the related art and to provide an artificial-photosynthesis array that can reduce mixing of hydrogen gas and oxygen gas and can keep an ion concentration or pH value in water constant.

In order to achieve the above object, the invention provides an artificial-photosynthesis array comprising a hydrogen gas generating part that generates hydrogen gas from an aqueous electrolyte solution; an oxygen gas generating part that generates oxygen gas from the aqueous electrolyte solution; a photoelectric conversion unit for supplying electrical energy from light and supplying electrical energy for generating the hydrogen gas in the hydrogen gas generating part and electrical energy for generating the oxygen gas in the oxygen gas generating part, the hydrogen gas generating part, the oxygen gas generating part, the photoelectric conversion unit being provided on a plane and being electrically connected together; an electrolytic chamber for hydrogen that contains the hydrogen gas generating part, the supplied aqueous electrolyte solution, and the generated hydrogen gas; and an electrolytic chamber for oxygen that contains the oxygen gas generating part, the supplied aqueous electrolyte solution, and the generated oxygen gas. The electrolytic chamber for hydrogen and the electrolytic chamber for oxygen include a plurality of artificial-photosynthesis modules that are isolated from each other so that the generated hydrogen gas and the generated oxygen gas do not mix with each other. The electrolytic chamber for hydrogen is connected to the electrolytic chamber for oxygen of another artificial-photosynthesis module adjacent thereto, and the electrolytic chamber for oxygen is connected to the electrolytic chamber for hydrogen of another artificial-photosynthesis module adjacent thereto. The artificial-photosynthesis module is inclined in a direction in which the hydrogen gas generating part and the oxygen gas generating part of another artificial-photosynthesis module are lined up. The aqueous electrolyte solution is supplied to the electrolytic chamber for hydrogen and the electrolytic chamber for oxygen of each of the artificial-photosynthesis modules at a predetermined flow rate.

It is preferable that the hydrogen gas generating part and the oxygen gas generating part are provided on the same plane, but the hydrogen gas generating part and the oxygen gas generating part may be provided on mutually different planes.

It is preferable that the hydrogen gas generating part and the oxygen gas generating part are arranged to be inclined with respect to the flow of the supplied aqueous electrolyte solution.

Additionally, for example, a plurality of photoelectric conversion elements of the photoelectric conversion unit may be connected in series.

It is preferable that each of the photoelectric conversion elements includes an inorganic semiconductor film having a pn junction. For example, the inorganic semiconductor film may include a CIGS compound semiconductor, or the inorganic semiconductor film may include a CZTS compound semiconductor.

Moreover, it is preferable that the hydrogen gas generating part is covered with a functional layer, and the functional layer is insoluble in a weak acidic solution and a weak alkaline solution, and has all of light permeability, water impermeability, and conductivity. Additionally, it is preferable that the functional layer has a co-catalyst provided on the surface thereof and is made of a metal or a conductive oxide (the overvoltage thereof is equal to or less than 0.5 V) or a complex thereof, and the co-catalyst is made of Pt, a substance containing Pt, or Rh.

It is preferable that the photoelectric conversion unit is covered with a protective layer, and the protective layer is insoluble in a weak acidic solution and a weak alkaline solution, and has all of light permeability, water impermeability, and insulation.

According to the invention, by devising the connection form of the plurality of artificial-photosynthesis modules, the ion concentration or pH value in water can be kept constant, and mixture of the hydrogen gas and the oxygen gas can be prevented.

DESCRIPTION OF THE PREFERRED EMBODIMENTS

Hereinafter, an artificial-photosynthesis array of the invention will be described in detail with reference to preferred embodiments illustrated in the attached drawings.

Figure 1:
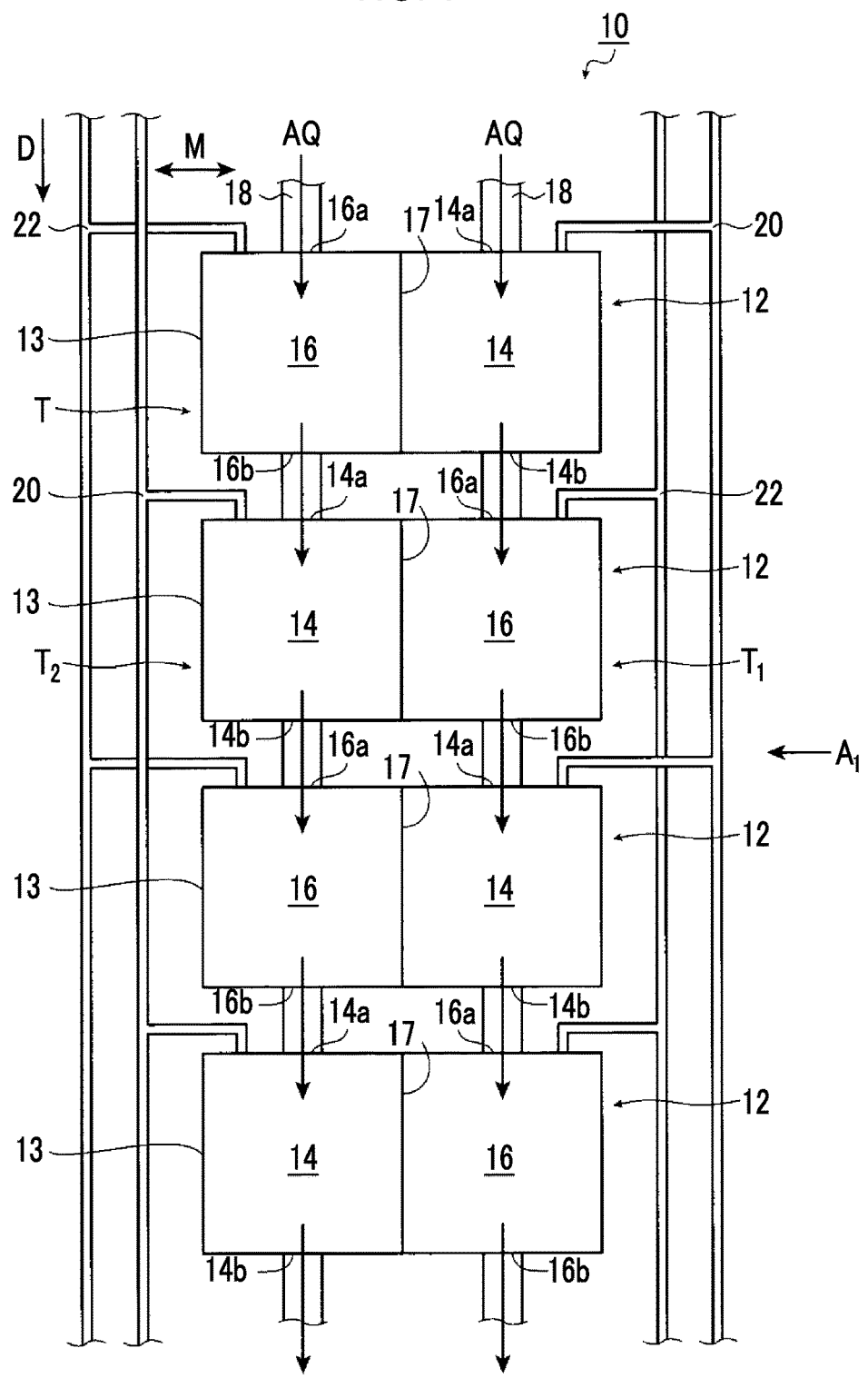
FIG. 1 is a schematic plan view illustrating an artificial-photosynthesis array of a first embodiment of the invention.
Figure 2:
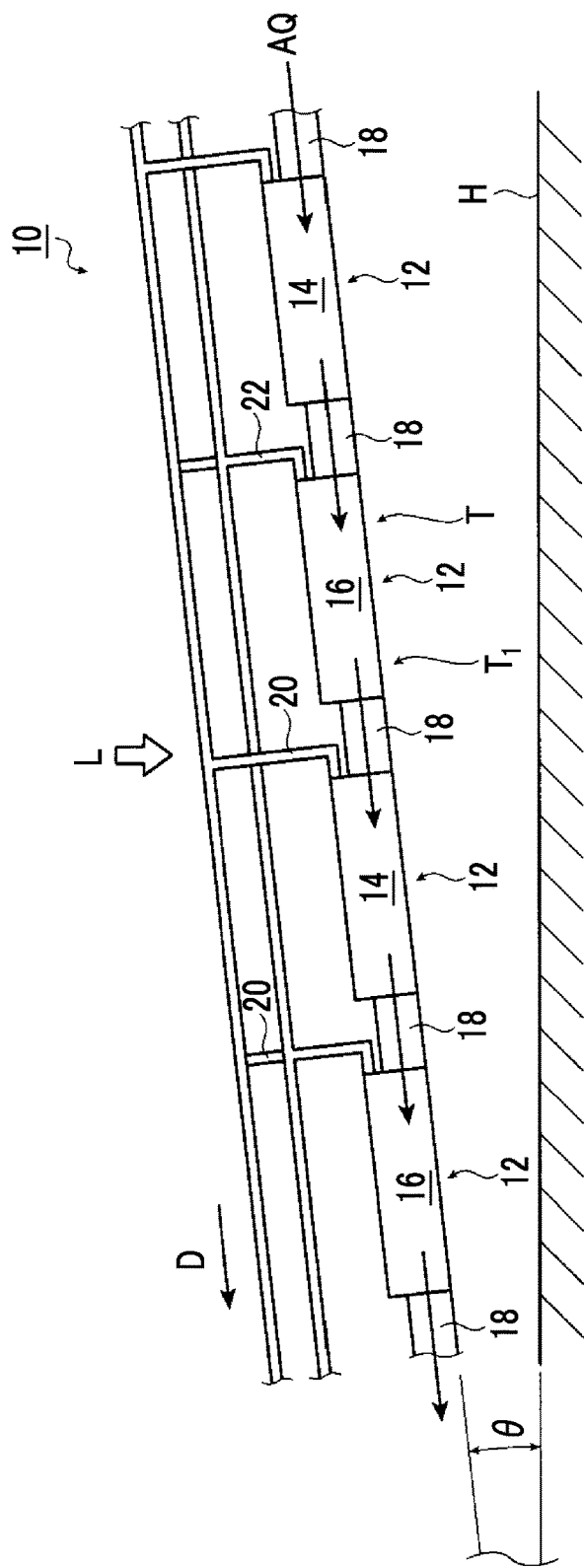
FIG. 2 is a side view of the artificial-photosynthesis array of the first embodiment illustrated in FIG. 1.

FIG. 1 is a schematic plan view illustrating an artificial-photosynthesis array of a first embodiment of the invention, and FIG. 2 is a side view of the artificial-photosynthesis array of the first embodiment illustrated in FIG. 1. In addition, FIG. 2 is a side view when an artificial-photosynthesis array 10 illustrated in FIG. 1 is seen from direction $A_1$.

As illustrated in FIG. 1, the artificial-photosynthesis array 10 has a plurality of artificial-photosynthesis modules 12, which are arranged in a row.

Each artificial-photosynthesis modules 12 receives light, and decompose a supplied aqueous electrolyte solution AQ to thereby obtain hydrogen gas and oxygen gas, and has a container 13, and have a photoelectric conversion unit 30, a hydrogen gas generating part 32, and an oxygen gas generating part 34 to be described below. An electrolytic chamber 14 for hydrogen that contains the aqueous electrolyte solution AQ supplied into the container 13, has hydrogen gas generated therein, and contains the generated hydrogen gas, an electrolytic chamber 16 for oxygen that contains the aqueous electrolyte solution AQ supplied into the container 13, has oxygen gas generated therein, and contains the generated oxygen gas are formed in the artificial-photosynthesis module 12. In the artificial-photosynthesis module 12, the electrolytic chamber 14 for hydrogen and the electrolytic chamber 16 for oxygen are arranged side by side within the container 13, and a partition wall 17 is provided between the electrolytic chamber 14 for hydrogen and the electrolytic chamber 16 for oxygen.

The container 13 constitutes an outer shell of the artificial-photosynthesis module 12, and has the electrolytic chamber 14 for hydrogen and the electrolytic chamber 16 for oxygen provided therein. The container 13 contains the aqueous electrolyte solution AQ, and contains the hydrogen gas and the oxygen gas that are generated.

In addition, the container 13 needs to have translucency in order to make the photoelectric conversion unit 30 irradiated with light. The specifications of the translucency are not particularly limited so long as the photoelectric conversion unit 30 can generate an electromotive force required to receive light and decompose the aqueous electrolyte solution AQ to thereby obtain hydrogen gas and oxygen gas.

In the artificial-photosynthesis array 10, a plurality of artificial-photosynthesis modules 12 are connected together in a direction D orthogonal to a direction M in which the electrolytic chamber 14 for hydrogen and the electrolytic chamber 16 for oxygen are lined up, and are forms a row. Hereinafter, in the direction D of FIG. 1, an upper side of a paper plane is referred to as an upstream side, and a lower side of the paper plane is referred to as a downstream side. In addition, in FIG. 2, in the direction D, a right side of the paper plane is referred to as an upstream side, and a left side of the paper plane is referred to as a downstream side. Additionally, the artificial-photosynthesis modules 12 that forms a row is referred to as an artificial-photosynthesis module row T.

The positions of the electrolytic chamber 14 for hydrogen and the electrolytic chamber 16 for oxygen in the direction M are reversely arranged in the artificial-photosynthesis modules 12 adjacent to each other in the direction D. Accordingly, in the direction D, the electrolytic chamber 16 for oxygen is arranged on the downstream side of the electrolytic chamber 14 for hydrogen, and the electrolytic chamber 14 for hydrogen is arranged on the downstream side of the electrolytic chamber 16 for oxygen.

In the artificial-photosynthesis module row T, a row on the side of the electrolytic chamber 14 for hydrogen of an artificial-photosynthesis module 12 nearest to the upstream side is defined as $T_1$, and a row on the side of the electrolytic chamber 16 for oxygen of an artificial-photosynthesis module 12 nearest to the upstream side is defined as $T_2$. A pipe 18 for supplying the aqueous electrolyte solution AQ to the electrolytic chamber 14 for hydrogen and the electrolytic chamber 16 for oxygen is provided in each of the row $T_1$ and the row $T_2$.

In the row $T_1$, the pipe 18 is connected to an injection port 14a of the electrolytic chamber 14 for hydrogen nearest to the upstream side, and a discharge port 14b of the electrolytic chamber 14 for hydrogen and an injection port 16a of the electrolytic chamber 16 for oxygen on the downstream side of the discharge port are connected together with the pipe 18. The discharge port 16b of the electrolytic chamber 16 for oxygen and the injection port 14a of the electrolytic chamber 14 for hydrogen on the downstream side of the discharge port are connected together with the pipe 18, and the discharge port 14b of the electrolytic chamber 14 for hydrogen and the injection port 16a of the electrolytic chamber 16 for oxygen on the downstream side of the discharge port are connected together with the pipe 18. The pipe 18 is connected to the discharge port 16b of the electrolytic chamber 16 for oxygen nearest to the downstream side.

Since the configuration of the row $T_2$ is the same as the configuration of the row $T_1$ except that, as compared to the row $T_1$, the order of the electrolytic chamber 14 for hydrogen and the electrolytic chamber 16 for oxygen is reversed and the pipe 18 is connected to the discharge port 14b of the electrolytic chamber 14 for hydrogen nearest to the downstream side, the detailed description thereof will be omitted.

In the artificial-photosynthesis module row T, on the row $T_1$ side, a hydrogen gas pipe 20 for delivering hydrogen to each electrolytic chamber 14 for hydrogen is connected, and an oxygen gas pipe 22 for delivering oxygen to each electrolytic chamber 16 for oxygen is connected.

In the artificial-photosynthesis module row T, on the row $T_2$ side, the hydrogen gas pipe 20 for delivering hydrogen gas to each electrolytic chamber 14 for hydrogen is connected, and the oxygen gas pipe 22 for delivering oxygen gas to each electrolytic chamber 16 for oxygen is connected.

In addition, the pipe 18, the hydrogen gas pipe 20, and the oxygen gas pipe 22 are connected to the container 13 and connected to the electrolytic chamber 14 for hydrogen and the electrolytic chamber 16 for oxygen in practice.

As illustrated in FIG. 2, the artificial-photosynthesis module row T is arranged so as to be inclined at a predetermined angle θ with respect to a plane H. For this reason, the aqueous electrolyte solution AQ supplied via the pipe 18 flows automatically from the upstream side to the downstream side, and is supplied to the electrolytic chamber 14 for hydrogen and the electrolytic chamber 16 for oxygen of each artificial-photosynthesis module 12. In order to supply the aqueous electrolyte solution AQ, the artificial-photosynthesis array includes a tank (not illustrated) in which the aqueous electrolyte solution AQ is stored, a pump (not illustrated) for supplying the aqueous electrolyte solution AQ from the tank to the pipe 18, and the like. Accordingly, the aqueous electrolyte solution AQ can be supplied to the electrolytic chamber 14 for hydrogen and the electrolytic chamber 16 for oxygen of each artificial-photosynthesis module 12 at a predetermined flow rate.

Additionally, in the artificial-photosynthesis array 10, as illustrated in FIG. 2, the artificial-photosynthesis module 12 is irradiated with light L from the hydrogen gas pipe 20 and oxygen gas pipe 22 side.

Here, the aqueous electrolyte solution AQ is, for example, a liquid using $H_2O$ as a main component, may be distilled water, or may be an aqueous solution using water as a solvent and containing solute. Water, for example, may be an electrolytic solution that is an aqueous solution containing an electrolyte, or may be cooling water used in a cooling tower or the like. The electrolytic solution is, for example, an aqueous solution containing an electrolyte, and is, for example, strong alkali (KOH), a polymer electrolyte (NAFION (registered trademark)), a 0.1-M sodium sulfate electrolytic solution, an electrolytic solution containing 0.1 M of $H_2SO_4$, a 0.1-M disodium hydrogen phosphate electrolytic solution, a 0.1-M potassium phosphate buffer solution, or the like.

Figure 3:
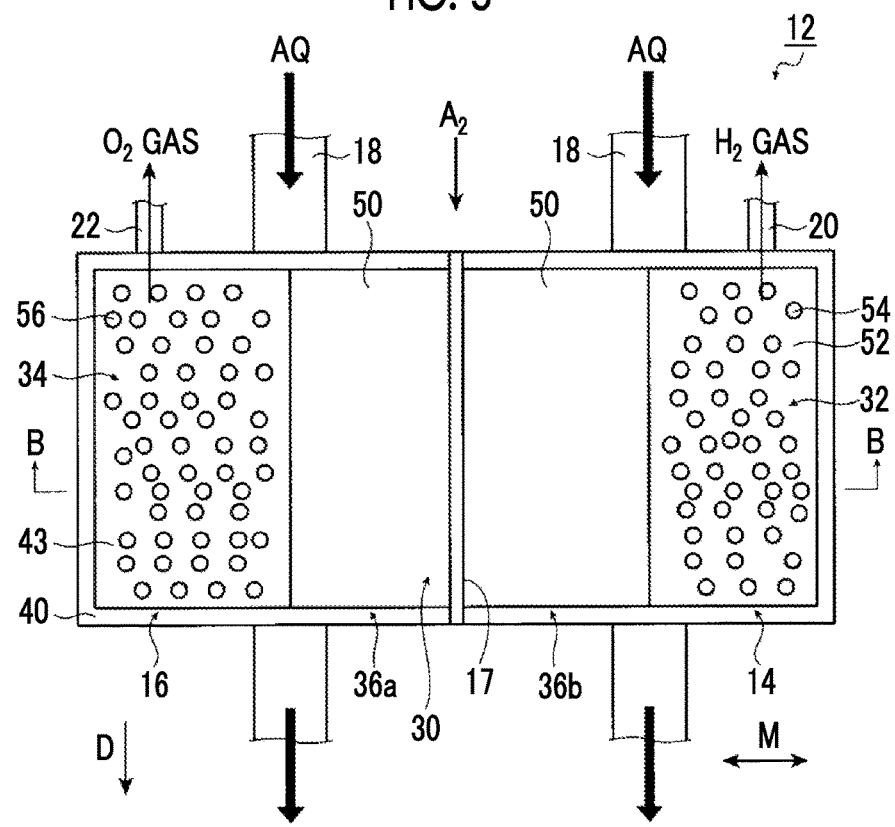
FIG. 3 is a schematic plane view illustrating an artificial-photosynthesis module that constitutes the artificial-photosynthesis array of the first embodiment of the invention.
Figure 4:
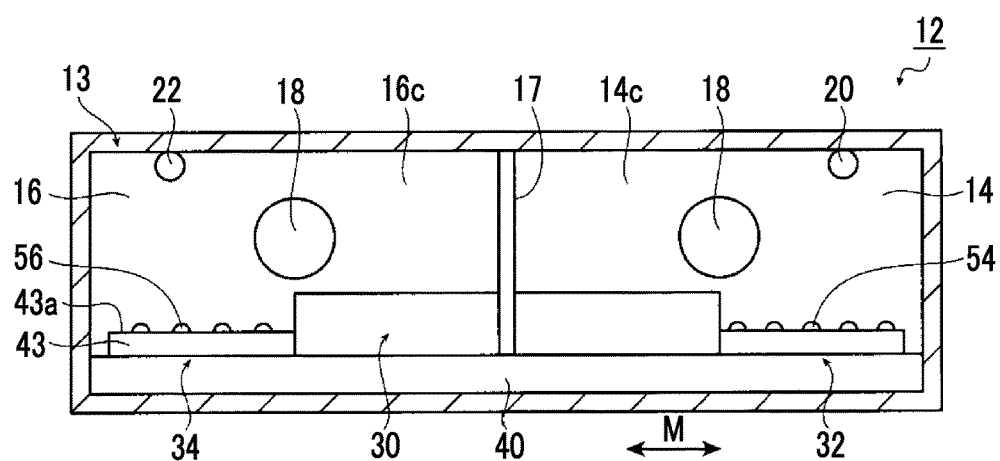
FIG. 4 is a schematic side view illustrating the artificial-photosynthesis module that constitutes the artificial-photosynthesis array of the first embodiment of the invention.
Figure 5:
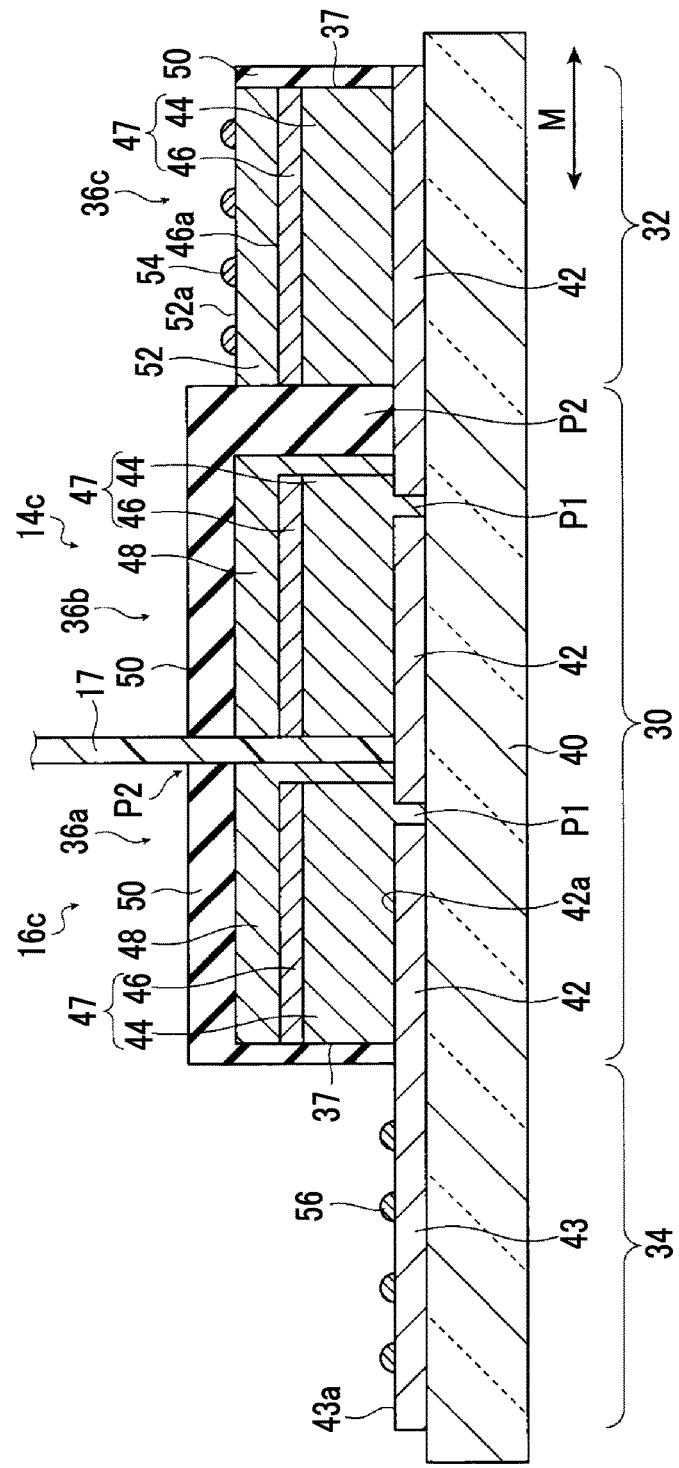
FIG. 5 is a schematic sectional view illustrating the configuration of the artificial-photosynthesis module that constitutes the artificial-photosynthesis array of the first embodiment of the invention in detail.

Next, an artificial-photosynthesis module 12 will be described in detail. FIG. 3 is a schematic plane view illustrating an artificial-photosynthesis module that constitutes the artificial-photosynthesis array of the first embodiment of the invention. FIG. 4 is a schematic side view illustrating the configuration of the artificial-photosynthesis module that constitutes the artificial-photosynthesis array of the first embodiment of the invention, and FIG. 5 is a schematic sectional view illustrating the configuration of the artificial-photosynthesis module that constitutes the artificial-photosynthesis array of the first embodiment of the invention in detail. FIG. 4 is a schematic side view as seen from direction $A_2$ of FIG. 3, and FIG. 5 is a sectional view taken along line B-B of FIG. 3.

As illustrated in FIG. 4, in the artificial-photosynthesis module 12, the electrolytic chamber 14 for hydrogen and the electrolytic chamber 16 for oxygen are separated by the partition wall 17 as described above.

The partition wall 17 is provided to isolate hydrogen gas generated by the electrolytic chamber 14 for hydrogen and an oxygen gas generated by the electrolytic chamber 16 for oxygen from each other so that these gases are not mixed together. For this reason, if the partition wall 17 has the above-described isolation function, the configuration thereof is not particularly limited.

In addition, in the invention, the ion concentration or the pH value of the electrolytic chamber 14 for hydrogen and the electrolytic chamber 16 for oxygen can be made constant by changing the arrangement of the artificial-photosynthesis module 12 as will be described below. For this reason, the partition wall 17 may not have a function to make the ion concentration or the pH value constant, and it is not necessary to have ion permeability and gas non-permeability as the partition wall 17.

As illustrated in FIGS. 3 to 5, the artificial-photosynthesis module 12 is an integrated structure in which the hydrogen gas generating part 32 and the oxygen gas generating part 34 are provided on a planar insulating substrate 40 with the photoelectric conversion unit 30 interposed therebetween. The photoelectric conversion unit 30, the hydrogen gas generating part 32, and the oxygen gas generating part 34 are provided on the insulating substrate 40, that is, on the same plane. The photoelectric conversion unit 30, the hydrogen gas generating part 32, and the oxygen gas generating part 34 are connected electrically.

The photoelectric conversion unit 30 is provided to receive light to generate electrical energy and to supply electrical energy for generating an oxygen gas with the oxygen gas generating part 34 and electrical energy for generating hydrogen gas with the hydrogen gas generating part 32.

The hydrogen gas generating part 32 is arranged in the inside 14c of the electrolytic chamber 14 for hydrogen, and the oxygen gas generating part 34 is arranged in the inside 16c of the electrolytic chamber 16 for oxygen.

In the artificial-photosynthesis module 12, for example, three pn junction cells 36a to 36c that are connected in series in the direction M are formed on the insulating substrate 40.

Two pn junction cells 36a and 36b among the pn junction cells 36a to 36c, function as photoelectric conversion elements, and constitute the photoelectric conversion unit 30. The remaining pn junction cell 36c constitutes the hydrogen gas generating part 32.

The insulating substrate 40 is not particularly limited if the insulating substrate has insulation and has strength such that the photoelectric conversion unit 30, the hydrogen gas generating part 32, and the oxygen gas generating part 34 can be supported. As the insulating substrate 40, for example, a soda lime glass (SLG) substrate or a ceramic substrate can be used. Additionally, one in which an insulating layer is formed on a metal substrate can be used for the insulating substrate 40. Here, as the metal substrate, a metal substrates, such as an Al substrate or an SUS substrate, or a complex metal substrate, such as a complex Al substrate made of a composite material consisting Al and, for example, with other metal, such as SUS, is available. In addition, the complex metal substrate is also a type of metal substrate, and the metal substrate and the complex metal substrate are collectively also referred to as the metal substrate. Moreover, a metal substrate with an insulating film having an insulating layer formed by anodized the surface of the Al substrate, or the like, can also be used as the insulating substrate 40. The insulating substrate 40 may be a flexible substrate or may not be such a flexible substrate. In addition to the above-described substrates, for example, glass plates, such as high strain-point glass and alkali-free glass, and a polyimide material can also be used as the insulating substrate 40.

The thickness of the insulating substrate 40 may be an arbitrary thickness without being particularly limited if the photoelectric conversion unit 30, the hydrogen gas generating part 32, and the oxygen gas generating part 34 can be supported. However, for example, the thickness of the insulating substrate may be about 20 μm to 20000 μm, is preferably 100 μm to 10000, and is more preferably 1000 μm to 5000 μm.

In addition, in a case where one including a CIGS-based compound semiconductor is used for the photoelectric conversion layer 44 of each of the pn junction cells 36a to 36c, the photoelectric conversion efficiency of the pn junction cells 36a and 36b are improved if alkali ions (for example, sodium (Na) ions: Na+) are supplied to the insulating substrate 40 side. Thus, it is preferable that an upper surface of the insulating substrate 40 is provided with an alkali supply layer for supplying alkali ions. It is to be noted that, for example, the alkali supply layer is unnecessary in the case of the SLG substrate.

The pn junction cells 36a and 36b are configured so that a back electrode 42, a photoelectric conversion layer 44, a buffer layer 46, a transparent electrode 48, and a protective layer 50 are laminated sequentially from the insulating substrate 40 side, and have the same configuration as photoelectric conversion elements used for a solar battery.

The pn junction cell 36c is configured so that the back electrode 42, the photoelectric conversion layer 44, and the buffer layer 46 are laminated sequentially from the insulating substrate 40 side.

In the pn junction cells 36a to 36c, a pn junction is formed at the interface between the photoelectric conversion layer 44 and the buffer layer 46. In addition, the photoelectric conversion layer 44 and the buffer layer 46 constitute an inorganic semiconductor film 47 having a pn junction.

In the photoelectric conversion unit 30, two pn junction cells 36a and 36b are connected in series in the direction M. However, the number of pn junction cells is not limited and may be one or three or more as long as an electromotive force that can generate hydrogen gas and oxygen gas can be obtained. Since a higher voltage can be obtained if a plurality of pn junction cells are connected in series, it is preferable that the plurality of pn junction cells are connected in series.

An opening groove P2 that passes through the buffer layer 46 and the photoelectric conversion layer 44 and reaches the surface of the back electrode 42 is formed at a position different from the formation position of a separation groove P1 in the direction M between the pn junction cell 36a and 36b. The partition wall 17 is provided in the opening groove P2.

In the artificial-photosynthesis module 12, if light enters the pn junction cells 36a and 36b from the protective layer 50 side, this light passes through the protective layer 50, each transparent electrode 48, and each buffer layer 46, and an electromotive force is generated in each photoelectric conversion layer 44, for example, an electric current (movement of a positive hole) that faces the back electrode 42 from the transparent electrode 48 is generated. For this reason, in the artificial-photosynthesis module 12, the hydrogen gas generating part 32 becomes a negative electrode (a cathode for electrolysis), and the oxygen gas generating part 34 becomes a positive electrode (an anode for electrolysis).

In addition, the type (polarity) of generated gases in the artificial-photosynthesis module 12 varies appropriately according to the configuration of the pn junction cells, the configuration of the artificial-photosynthesis module 12, or the like.

The protective layer 50 is insoluble in a weak acidic solution and a weak alkaline solution, and has light permeability, water impermeability, and insulation together.

The protective layer 50 has translucency, and is provided so as to cover, specifically, portions other than a hydrogen gas generation region in the inside 14*c* of the electrolytic chamber 14 for hydrogen and portions other than an oxygen gas generation region in the inside 16*c* of the electrolytic chamber 16 for oxygen, in order to protect the pn junction cells 36*a* and 36*b*. Specifically, the protective layer 50 covers the whole surface of the transparent electrode 48, and a side surface 37 of the pn junction cell 36*a*.

The protective layer 50 is made of, for example, $SiO_2$, $SnO_2$, $Nb_2O_5$, $TA_2O_5$, $Al_2O_3$, $Ga_2O_3$, or the like. Additionally, the thickness of the protective layer 50 is not particularly limited, and is preferably 100 nm to 1000 nm.

In addition, methods for forming the protective layer 50 are not particularly limited, and the protective layer 50 can be formed by an RF sputtering method, a DC reactive sputtering method, a MOCVD method, and the like.

Additionally, the protective layer 50 may be made of, for example, insulating epoxy resin, insulating silicone resin, insulating fluororesin, or the like. In this case, the thickness of the protective layer 50 is not particularly limited and is preferably 2 μm to 1000 μm.

In the hydrogen gas generating part 32, a functional layer 52 is formed on a surface 46*a* of the buffer layer 46 of the pn junction cell 36*c*. A co-catalyst 54 for promoting generation of hydrogen is formed in the shape of lands so as to be dotted on a surface 52*a* of the functional layer 52.

The functional layer 52 constitutes the hydrogen gas generating part 32, and a transparent conductive protective film is used as the functional layer. The functional layer 52 is insoluble in a weak acidic solution and a weak alkaline solution, and has all of light permeability, water impermeability, and conductivity.

In addition, in the hydrogen gas generating part 32, it is preferable that the side surface 37 of the pn junction cell 36*c* and a side surface of the functional layer 52 that are exposed in the inside 14*c* of the electrolytic chamber 14 for hydrogen is covered with the protective layer 50 in order to prevent these side surfaces from coming into contact with the aqueous electrolyte solution AQ and being short-circuited.

The functional layer 52 supplies electrons to hydrogen ions (protons) $H^+$ ionized from a water molecule to generate a hydrogen molecule, that is, hydrogen gas, $(2H^+ + 2e^- \rightarrow H_2)$, and the surface 52*a* thereof functions as a hydrogen gas generation surface. Therefore, the functional layer 52 functions as the hydrogen gas generating part 32, and a region thereof constitutes the hydrogen gas generation region.

It is preferable that the functional layer 52 is made of, for example, a metal or a conductive oxide (the overvoltage thereof is equal to or less than 0.5 V) or a complex thereof. More specifically, the same transparent conductive film as the transparent electrodes 48, such as ZnO in which ITO, Al, B, Ga, In, or the like is doped or IMO ($In_2O_3$ to which Mo is added) can be used for the functional layer 52. The functional layer 52 may be a single layer structure, similar to the transparent electrode 48, or a laminated structure, such as a two-layer structure. Additionally, the thickness of the functional layer 52 is not particularly limited, is preferably 10 nm to 1000 nm, and is more preferably 50 nm to 500 nm.

In addition, methods for forming the functional layer 52 are not particularly limited, and the functional film can be formed by vapor phase film forming methods or coating methods, such as an electron-beam vapor deposition method, a sputtering method, and a CVD method, similar to the transparent electrode 48.

The co-catalyst 54 includes, for example, simple substances consisting of Pt, Pd, Ni, Au, Ag, Ru, Cu, Co, Rh, Ir, Mn, and the like, alloys obtained by combining these simple substances, and oxides thereof, for example, NiOx, and $RuO_2$. Additionally, the size of the co-catalyst 54 is not particularly limited, and is preferably 0.5 nm to 1 μm.

In addition, methods for forming the co-catalyst 54 are not particularly limited, and the co-catalyst can be formed by a coating baking method, an optical electrodeposition method, a sputtering method, an impregnating method, and the like.

Although it is preferable that the co-catalyst 54 is provided on the surface 52*a* of the functional layer 52, the co-catalyst may not be provided in a case where sufficient generation of hydrogen gas is possible.

Additionally, the co-catalyst 54 is formed so as to be dotted on the surface 52*a* of the functional layer 52 formed on the surface 46*a* of the buffer layer 46. However, the invention is not limited to this. The functional layer 52 may not be provided, but the co-catalyst 54 may be formed in the shape of lands so as to be directly dotted on the surface 46*a* of the buffer layer 46.

In this case, the buffer layer 46 functions as an n-type semiconductor, functions as an electrode for generation of hydrogen, and the surface 46*a* thereof functions as the hydrogen gas generation surface. Therefore, the buffer layer 46 functions as the hydrogen gas generating part 32, and a region thereof constitutes the hydrogen gas generation region.

The oxygen gas generating part 34 consists of a of an extending portion of the back electrode 42 of the pn junction cell 36*a* at the right end, and this region 43 becomes the oxygen gas generation region.

Specifically, the region 43 of the extending portion of the back electrode 42 of the pn junction cell 36*a* is the oxygen gas generating part 34 that takes out electrons from hydroxyl ions $OH^-$ ionized from a water molecule, and generates an oxygen molecule, that is, an oxygen gas, $(2OH^- \rightarrow H_2O + O_2/2 + 2e^-)$, and the surface 43*a* functions as an oxygen gas generation surface.

The co-catalyst 56 for generation of oxygen is formed in the shape of lands so as to be dotted on the surface 43*a* of the region 43 of the back electrode 42. The co-catalyst 56 for generation of oxygen is made of, for example, $IrO_2$, $CoO_x$, or the like. Additionally, the size of the co-catalyst 56 for generation of oxygen is not particularly limited, and is preferably 0.5 nm to 1 μm.

In addition, methods for forming the co-catalyst 56 for generation of oxygen are not particularly limited, and the co-catalyst for generation of oxygen can be formed by a coating baking method, a dipping method, an impregnating method, a sputtering method, a vapor deposition method, and the like.

Hereinafter, the respective parts that constitute the photoelectric conversion unit 30 will be described.

The back electrode 42 is made of, for example, metal, such as Mo, Cr, and W, or combination thereof. The back electrode 42 may be a single layer structure, or may be a laminated structures, such as a two-layer structure. It is preferable that the back electrode 42 is made of Mo among them. Although the film thickness of the back electrode 42 is generally about 800 um, it is preferable that the thickness of the back electrode 42 is 400 nm to 1 μm.

As described above, the pn junction cells 36a and 36b function as photoelectric conversion elements, and have the photoelectric conversion layer 44 and the buffer layer 46.

The photoelectric conversion layer 44 is a layer in which a pn junction having the photoelectric conversion layer 44 side as a p type and having the buffer layer 46 side as an n type is formed at the interface between the photoelectric conversion layer and the buffer layer 46, and the light transmitted through and reaching the protective layer 50, the transparent electrode 48, and the buffer layer 46 is absorbed to generate a positive hole on the p side and generate an electron on the n side. The photoelectric conversion layer 44 has a photoelectric conversion function. In the photoelectric conversion layer 44, the positive hole generated in the pn junction is moved from the photoelectric conversion layer 44 to the back electrode 42 side, and the electron generated in the pn junction is moved from the buffer layer 46 to the transparent electrode 48 side. The film thickness of the photoelectric conversion layer 44 is preferably 0.5 μm to 3.0 μm, and is particularly preferably 1.0 μm to 2.0 μm.

It is preferable that the photoelectric conversion layer 44 is constituted of, for example, a CIGS-based compound semiconductor or a CZTS-based compound semiconductor that has a chalcopyrite crystal structure. That is, it is preferable that the photoelectric conversion layer 44 is constituted of the CIGS-based compound semiconductor layer. The CIGS-based compound semiconductor layer may be made of well-known substances used for CIGS systems, such as $CuInSe_2$ (CIS) and $CuGaSe_2$ (CGS) as well as $Cu(In, Ga)Se_2$ (CIGS).

In addition, as methods for a CIGS layer, 1) a multi-source vapor deposition method, 2) a selenide method, 3) a sputtering method, 4) a hybrid sputtering method, 5) mechano-chemical process method, and the like are known.

Other methods for forming the CIGS layer include a screen printing method, a proximity sublimating method, an MOCVD method, a spray method (wet film-forming method), and the like. For example, crystal with a desired composition can be obtained, for example, by forming a particulate film containing an Ib group element, a IIIb group element, and a VIb group element on a substrate, using the screen printing method (wet film-forming method), the spray method (wet film-forming method), or the like, and performing thermal decomposition processing (in this case, may be thermal decomposition processing in a VIb group element atmosphere) or the like (JP1997-74065 (JP-H09-74065) and JP1997-74213 (JP-H09-74213)).

In the invention, as described above, it is preferable that the photoelectric conversion layer 44 is constituted of, for example, the CIGS-based compound semiconductor or the CZTS-based compound semiconductor that has the chalcopyrite crystal structure. However, the invention is not limited to this, and the photoelectric conversion layer may be arbitrary photoelectric conversion elements so long as a pn junction consisting of an inorganic semiconductor can be formed, and hydrogen gas and oxygen gas can be generated by causing a photolysis reaction of water. For example, a photoelectric conversion element used for a solar battery cell that constitutes a solar battery is used preferably. Such a photoelectric conversion element includes a thin film silicon-based thin film type photoelectric conversion element, a CdTe-based thin film type photoelectric conversion element, a dye-sensitization-based thin film type photoelectric conversion element, or an organic thin film type photoelectric conversion element, in addition to a CIGS-based thin film type photoelectric conversion element, a CIS-based thin film type photoelectric conversion element and a CZTS-based thin film type photoelectric conversion element.

In addition, the absorption wavelength of an inorganic semiconductor that forms the photoelectric conversion layer 44 is not particularly limited if the absorption wavelength is in a wavelength band where photoelectric conversion is allowed. Although it is sufficient if the absorption wavelength includes the wavelength band of solar light or the like, particularly, the visible wavelength band to the infrared wavelength band, it is preferable that the absorption wavelength end of the absorption wavelength includes 800 nm or more, that is, the infrared wavelength band. This is because solar light energy can be utilized as much as possible. Meanwhile the absorption wavelength end having a long wavelength is equivalent to a band gap becoming small, and it can be expected from this that an electromotive force for assisting water decomposition decreases. As a result, since it can be expected that the number of connections to be connected in series for the water decomposition increases, it is not necessarily good that the absorption end is longer.

The buffer layer 46 constitutes the inorganic semiconductor film 47 that has the pn junction together with the photoelectric conversion layer 44. That is, the pn junction is formed at the interface between the butter layer and the photoelectric conversion layer 44. Additionally, the buffer layer 46 protects the photoelectric conversion layer 44 when the transparent electrode 48 is formed, and is formed in order to transmit the light, which has entered the transparent electrode 48, through the photoelectric conversion layer 44.

Specifically, it is preferable that the buffer layer 46 includes, for example, metal sulfide containing at least one kind of metallic elements selected from a group consisting of Cd, Zn, Sn, and In, such as CdS, ZnS, Zn (S, O), and/or Zn (S, O, OH), SnS, Sn (S, O), and/or Sn (S, O, OH), InS, In (S, O), and/or In (S, O, OH). The film thickness of the buffer layer 46 is preferably 10 nm to 2 μm, and is more preferably 15 nm to 200 nm. The buffer layer 46 is formed by, for example, a chemical bath deposition method (hereinafter referred to as a CBD method).

In addition, for example, a window layer may be provided between the buffer layer 46 and the transparent electrode 48. This window layer is constituted of, for example, a ZnO layer with a thickness of about 10 nm.

The transparent electrode 48 has translucency, takes light into the photoelectric conversion layer 44, makes a pair together with the back electrode 42, functions as an electrode that moves a positive hole and an electron generated in the photoelectric conversion layer 44 (an electric current flows), and functions as a transparent conductive film for connecting the two pn junction cells 36a and 36b in series.

The transparent electrode 48 is made of, for example, ZnO or ITO in which Al, B, Ga, In, or the like is doped. The transparent electrode 48 may be a single layer structure, or may be a laminated structures, such as a two-layer structure. Additionally, the thickness of the transparent electrode is not limited, and is preferably 0.3 μm to 1 μm.

In addition, methods for forming the transparent electrode are not particularly limited, and the functional film can be formed by vapor phase film forming methods or coating methods, such as an electron-beam vapor deposition method, a sputtering method, and a CVD method.

In addition, although the transparent conductive film for connecting the adjacent pn junction cells 36a and 36b in series is not necessarily limited to the transparent electrode 48, it is good to simultaneously form the same transparent conductive film as the transparent electrode 48 from the viewpoint of easiness of manufacture.

That is, a conductive film for connecting the adjacent pn junction cells 36a and 36b in series can be formed by forming the opening groove P2 reaching the surface of the back electrode 42 on the photoelectric conversion layer 44 by a laser scribe or a mechanical scribe after the buffer layer 46 is laminated, forming a transparent conductive film constituting the transparent electrode 48 on the buffer layer 46 so as to fill the opening groove P2 and then removing a right portion (in the drawing) of the transparent conductive film within each opening groove P2 by a scribe to form a slightly small opening groove P2 again reaching the surface of the back electrode 42, and leaving the conductive film for directly connecting the back electrode 42 and the transparent electrode 48 of the adjacent pn junction cells 36a and 36b.

Next, a method for manufacturing the artificial-photosynthesis module 12 will be described.

In addition, the method for manufacturing the artificial-photosynthesis module 12 is not limited to a manufacturing method illustrated below.

First, for example, a soda lime glass substrate that becomes the insulating substrate 40 is prepared.

Next, for example, an Mo film or the like that becomes the back electrode 42 is formed on the surface of the insulating substrate 40 by the sputtering method using a film formation apparatus.

Next, the separation groove P1 extending in a width direction of the insulating substrate 40 is formed by scribing the Mo film at a predetermined position, for example, using the laser scribe method. Accordingly, the back electrode 42 separated from each other by the separation groove P1 is formed.

Next, for example, a CIGS film (p-type semiconductor layer) is formed as the photoelectric conversion layer 44 so as to cover the back electrode 42 and fill the separation groove P1. This CIGS film is formed by any one of the aforementioned film formation methods.

Next, for example, a CdS layer (n-type semiconductor layer) that becomes the buffer layer 46 is formed on the photoelectric conversion layer 44 by the CBD method.

Next, two opening grooves P2 that extend in the width direction of the insulating substrate 40 and reach the surface 42a of the back electrode 42 through the photoelectric conversion layer 44 from the buffer layer 46 are formed at positions different from the formation position of the separation groove P1 in the direction M. In this case, a laser scribe method or a mechanical scribe method can be used as the scribe method.

Next, a ZnO layer that becomes the transparent electrode 48, and has, for example, Al, B, Ga, Sb, or the like added thereto is formed by the sputtering method or the coating method so as to extend in the width direction of the insulating substrate 40 and fill each opening groove P2 on the buffer layer 46.

Next, two slightly narrow opening grooves P2 reaching the surface of the back electrode 42 are formed again by removing a portion of the ZnO layer within the opening groove P2 so as to leave a portion on the right side of the drawing. Even this case, the laser scribe method or the mechanical scribe method can be used as the scribe method. The three pn junction cells 36a to 36c are formed in this way.

Next, for example, an $SiO_2$ film that becomes the protective layer 50 is formed in the outer surfaces of the pn junction cells 36a and 36b that constitute the photoelectric conversion unit 30, the surface of the back electrode 42 on the bottom surfaces of the two opening grooves P2, and the side surface 37 of the pn junction cell 36c by the RF sputtering method.

Next, a groove is again formed at a position equivalent to each opening groove P2 between the pn junction cell 36a and the pn junction cell 36b, and the partition wall 17 is provided in this groove.

Next, the ZnO layer of the pn junction cell 36c is peeled using the laser scribe method or the mechanical scribe method, and for example, the ZnO layer to which Al, B, Ga, Sb, or the like is added is formed as the functional layer 52 on the surface 46a of the exposed buffer layer 46 by the sputtering method using a patterning mask, or the coating method.

Next, for example, a Pt co-catalyst that becomes the co-catalyst 54 for generation of hydrogen is carried in the functional layer 52 by an optical electrodeposition method.

Next, the region 43 is exposed by removing the deposit on the region 43 of the extending portion of the back electrode 42 of the pn junction cell 36a, using the laser scribe method or the mechanical scribe method.

Then, for example, a CoOx co-catalyst that becomes the co-catalyst 56 for generation of oxygen is carried in the surface 43a of the region 43, for example, by the dipping method.

The container 13 with almost the same size as the insulating substrate 40 is prepared, and the insulating substrate 40 in which the photoelectric conversion unit 30, the hydrogen gas generating part 32, and the oxygen gas generating part 34 are formed is housed within the container 13. Accordingly, the electrolytic chamber 14 for hydrogen and the electrolytic chamber 16 for oxygen are formed by the partition wall 17.

The artificial-photosynthesis module 12 can be manufactured in this way.

In addition, as the artificial-photosynthesis module 12, there is one in which the arrangement of the hydrogen gas generating part 32 and the oxygen gas generating part 34 is reversed to that of the above-described example. Since this can be realized by changing and arranging the orientation of the artificial-photosynthesis module 12, the manufacturing method does not change.

The artificial-photosynthesis array 10 can be manufactured by arranging a predetermined number of the artificial-photosynthesis modules 12, inclining these modules at a predetermined angle θ, and connecting the pipe 18, the hydrogen gas pipe 20, and the oxygen gas pipe 22 to the container 13.

In the artificial-photosynthesis array 10 of the present embodiment, each artificial-photosynthesis module 12 is irradiated with the light L (refer to FIG. 2), and the aqueous electrolyte solution AQ is supplied so as to become parallel to, for example, a surface (the surface 52a of the functional layer 52) in which the co-catalyst 54 for generation of hydrogen of the hydrogen gas generating part 32 is formed and a surface (the surface 43a of the region 43) in which the co-catalyst 56 for generation of oxygen of the oxygen gas generating part 34 is formed.

An electromotive force is generated in the photoelectric conversion unit 30 by the irradiation of the light L (refer to FIG. 2), and the aqueous electrolyte solution AQ is decomposed in each electrolytic chamber 14 for hydrogen by the electrical energy of the photoelectric conversion unit 30, and thereby hydrogen gas is generated, is moved to the upstream side via the hydrogen gas pipe 20, and is recovered. In each electrolytic chamber 16 for oxygen, the aqueous electrolyte solution AQ is decomposed, and thereby an oxygen gas is generated, is moved to the upstream side via the oxygen gas pipe 22, and is recovered. In this case, since the artificial-photosynthesis module row T is inclined at the predetermined angle θ, the aqueous electrolyte solution AQ flows to the artificial-photosynthesis module 12 on the downstream side. Additionally, since the artificial-photosynthesis module row is inclined at the angle θ, the hydrogen gas and the oxygen gas are apt to move to the upstream side.

The artificial-photosynthesis array 10 of the present embodiment alternately connect the electrolytic chamber 14 for hydrogen and the electrolytic chamber 16 for oxygen in the order of the electrolytic chamber 14 for hydrogen and the electrolytic chamber 16 for oxygen or in the order of the electrolytic chamber 16 for oxygen and the electrolytic chamber 14 for hydrogen, from the upstream side, using the plurality of artificial-photosynthesis modules 12. By connecting the electrolytic chambers in this way, gases are generated in the order of the hydrogen gas and the oxygen gas from water or in the order of the oxygen gas and the hydrogen gas from water. Accordingly, the occurrence of a difference in ion concentration or pH value in water can be suppressed, and degradation in water decomposition capability can also be suppressed. In this way, in the entire system of the artificial-photosynthesis array 10, the ion concentration or the pH value in water can be kept constant. Moreover, it is not necessary to provide an ion exchange membrane as a partition wall.

Additionally, since the artificial-photosynthesis array 10 is inclined at the angle θ, the hydrogen gas generated in each hydrogen gas generating part 32 can rise upward in the inside 14*c* of the electrolytic chamber 14 for hydrogen and move to the artificial-photosynthesis module 12 side on the upstream side via the hydrogen gas pipe 20, and thereby the hydrogen gas can be recovered easily. Similarly, the oxygen gas generated in each oxygen gas generating part 34 can rise upward in the inside 16*c* of the electrolytic chamber 16 for oxygen and move to the artificial-photosynthesis module 12 side on the upstream side via the oxygen gas pipe 22, and thereby the oxygen gas can be recovered easily.

Next, a second embodiment of the invention will be described.

Figure 6:
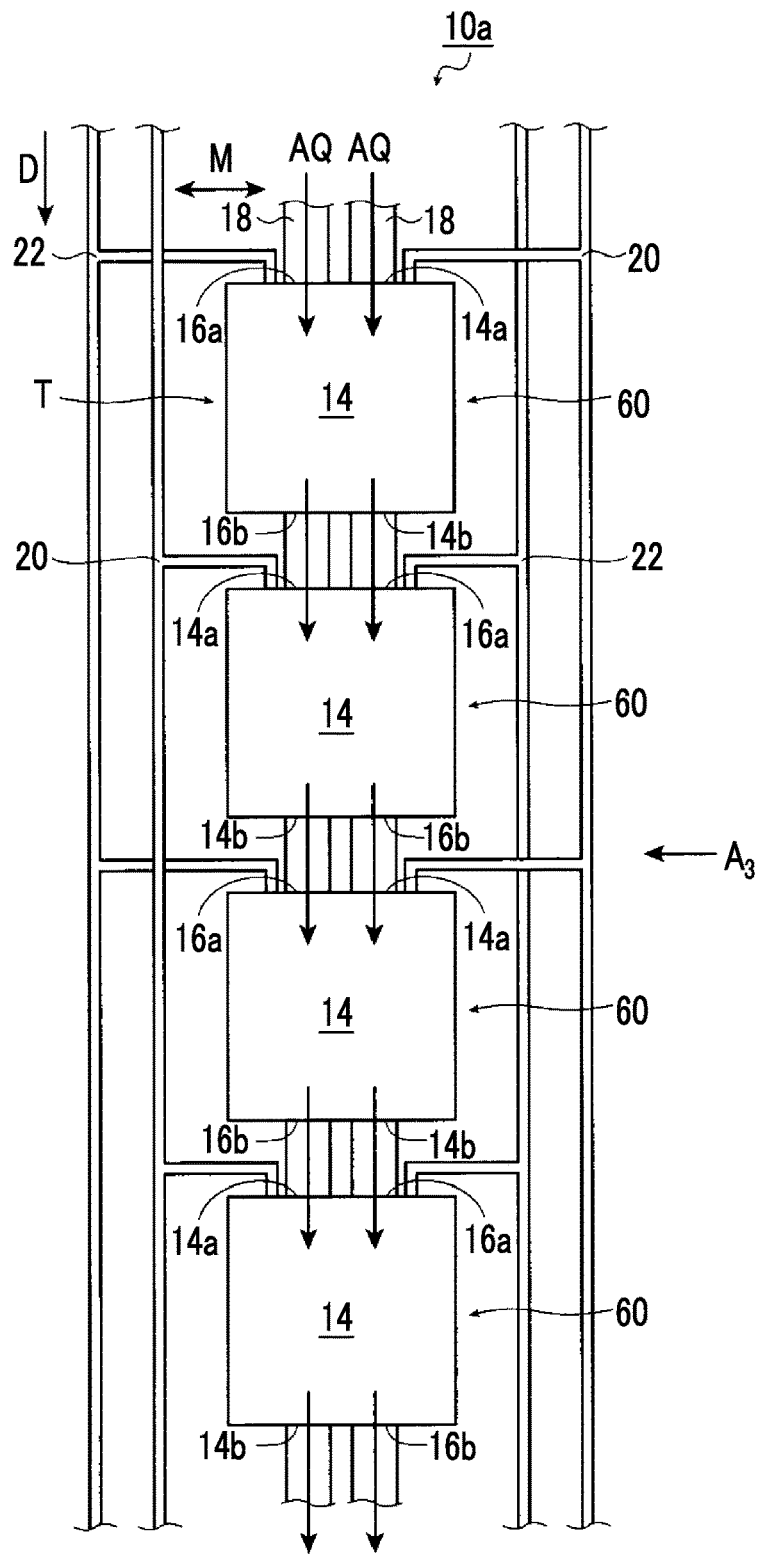
FIG. 6 is a schematic plan view illustrating an artificial-photosynthesis array of a second embodiment of the invention.
Figure 7:
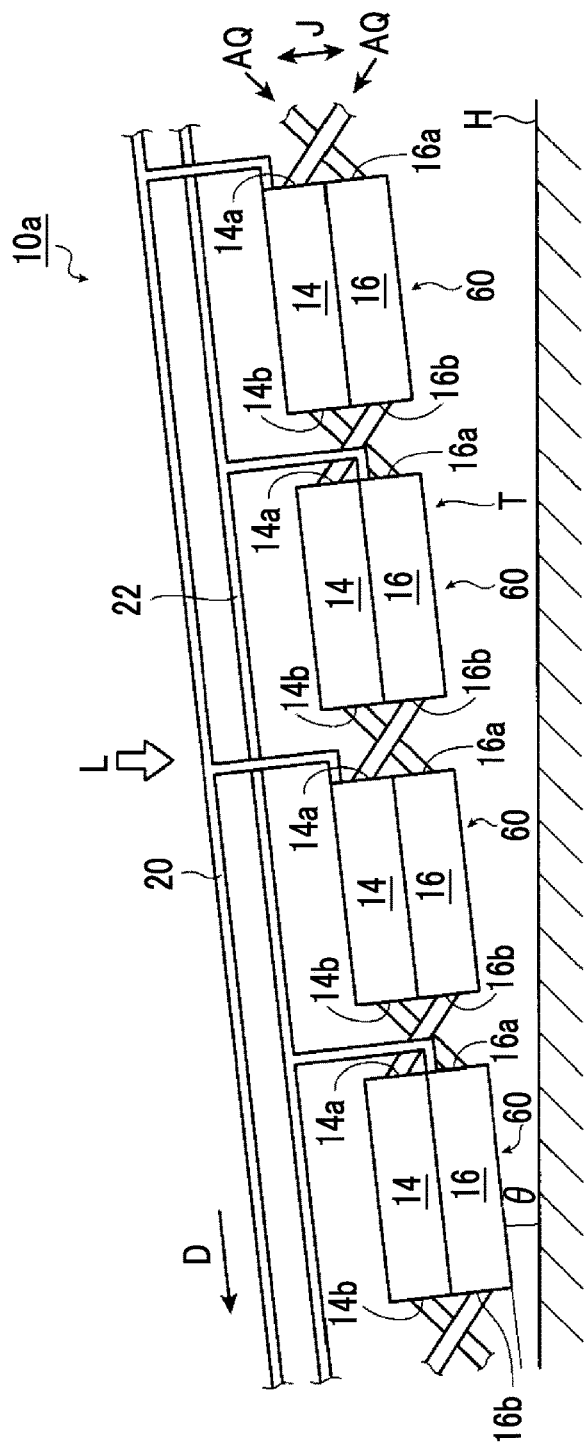
FIG. 7 is a side view of the artificial-photosynthesis array of the second embodiment illustrated in FIG. 6.

FIG. 6 is a schematic plan view illustrating an artificial-photosynthesis array of a second embodiment of the invention, and FIG. 7 is a side view of an artificial-photosynthesis array of the second embodiment illustrated in FIG. 6. In addition, FIG. 7 is a side view when an artificial-photosynthesis array 10*a* illustrated in FIG. 6 is seen from direction A$_3$.

In the artificial-photosynthesis array 10*a* of the present embodiment, the same structures as those of the artificial-photosynthesis array 10 illustrated in FIGS. 1 and 2 will be designated by the same reference signs, and the detailed description thereof will not be described. Additionally, the artificial-photosynthesis array 10*a* has artificial-photosynthesis modules 60. In each artificial-photosynthesis module 60, the same structures as those of the artificial-photosynthesis module 12 illustrated in FIGS. 3 to 5 will be designated by the same reference signs, and the detailed description thereof will not be described.

Since the artificial-photosynthesis array 10*a* illustrated in FIG. 6 is the same as the artificial-photosynthesis array 10 illustrated in FIGS. 1 and 2 except that, compared to the artificial-photosynthesis array 10 illustrated in FIGS. 1 and 2, the configuration of the artificial-photosynthesis module 60 and the arrangement form of the artificial-photosynthesis module 60 differ and the connection forms of the pipe 18, the hydrogen gas pipe 20, and the oxygen gas pipe 22 differ, the detailed description thereof will be omitted.

Hereinafter, in the direction D of FIG. 6, an upper side of a paper plane is referred to as an upstream side, and a lower side of the paper plane is referred to as a downstream side. In addition, in FIG. 7, in the direction D, a right side of the paper plane is referred to as an upstream side, and a left side of the paper plane is referred to as a downstream side.

In the artificial-photosynthesis array 10*a* illustrated in FIG. 6 and FIG. 7, the artificial-photosynthesis modules 60 having a configuration in which the electrolytic chamber 14 for hydrogen and the electrolytic chamber 16 for oxygen are laminated on each other and isolated from each other in a direction J are used. In the artificial-photosynthesis array 10*a*, the artificial-photosynthesis modules 60 are arranged in one row, and forms the artificial-photosynthesis module row T. As illustrated in FIG. 7, the artificial-photosynthesis modules 60 are arranged such that the electrolytic chambers 14 for hydrogen are directed to a direction opposite to the plane H, and the artificial-photosynthesis module row T is inclined at a predetermined angle θ with respect to the plane H.

In the artificial-photosynthesis module row T, as illustrated in FIG. 6 and FIG. 7, the pipe 18 is connected to the injection port 14*a* of the electrolytic chamber 14 for hydrogen of the artificial-photosynthesis module 60 nearest to the upstream side, and the discharge port 14*b* of the electrolytic chamber 14 for hydrogen and the injection port 16*a* of the electrolytic chamber 16 for oxygen on the downstream side of the discharge port are connected together with the pipe 18. The discharge port 16*b* of the electrolytic chamber 16 for oxygen and the injection port 14*a* of the electrolytic chamber 14 for hydrogen on the downstream side of the discharge port are connected together with the pipe 18, and the discharge port 14*b* of the electrolytic chamber 14 for hydrogen and the injection port 16*a* of the electrolytic chamber 16 for oxygen on the downstream side of the discharge port are connected together with the pipe 18. The pipe 18 is connected to the discharge port 16*b* of the electrolytic chamber 16 for oxygen nearest to the downstream side.

Additionally, as illustrated in FIG. 6 and FIG. 7, the pipe 18 is connected to the injection port 16*a* of the electrolytic chamber 16 for oxygen of the artificial-photosynthesis module 60 nearest to the upstream side, and the discharge port 16*b* of the electrolytic chamber 16 for oxygen and the injection port 14*a* of the electrolytic chamber 14 for hydrogen on the downstream side of the discharged port are connected together with the pipe 18. The discharge port 14*b* of the electrolytic chamber 14 for hydrogen and the injection port 16*a* of the electrolytic chamber 16 for oxygen on the downstream side of the discharge port are connected together with the pipe 18. The discharge port 16*b* of the electrolytic chamber 16 for oxygen and the injection port 14*a* of the electrolytic chamber 14 for hydrogen on the downstream side of the discharge port are connected together with the pipe 18. The pipe 18 is connected to the discharge port 14*b* of the electrolytic chamber 14 for hydrogen nearest to the downstream side.

In the present embodiment, when seen from a side surface as illustrated in FIG. 7, the pipes 18 are connected so as to intersect each other.

Additionally, in the artificial-photosynthesis array 10*a*, as illustrated in FIG. 7, each artificial-photosynthesis module 60 is irradiated with light L from the electrolytic chamber 14 side for hydrogen.

Figure 8:
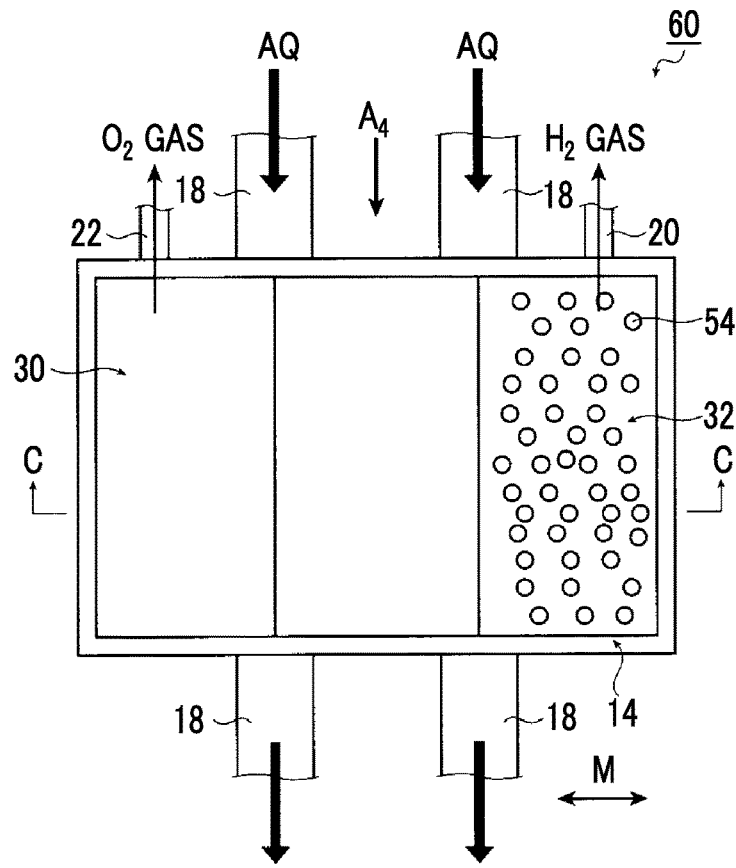
FIG. 8 is a schematic plane view illustrating an artificial-photosynthesis module that constitutes the artificial-photosynthesis array of the second embodiment of the invention.
Figure 9:
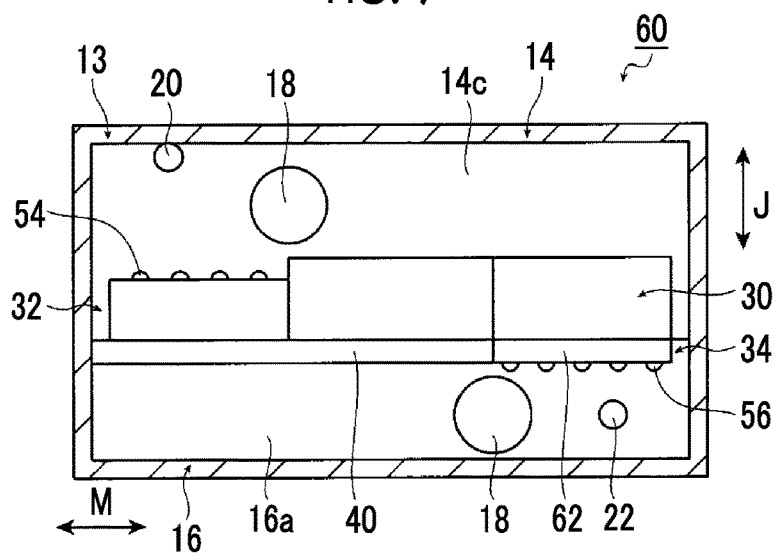
FIG. 9 is a schematic side view illustrating the artificial-photosynthesis module that constitutes the artificial-photosynthesis array of the second embodiment of the invention.
Figure 10:
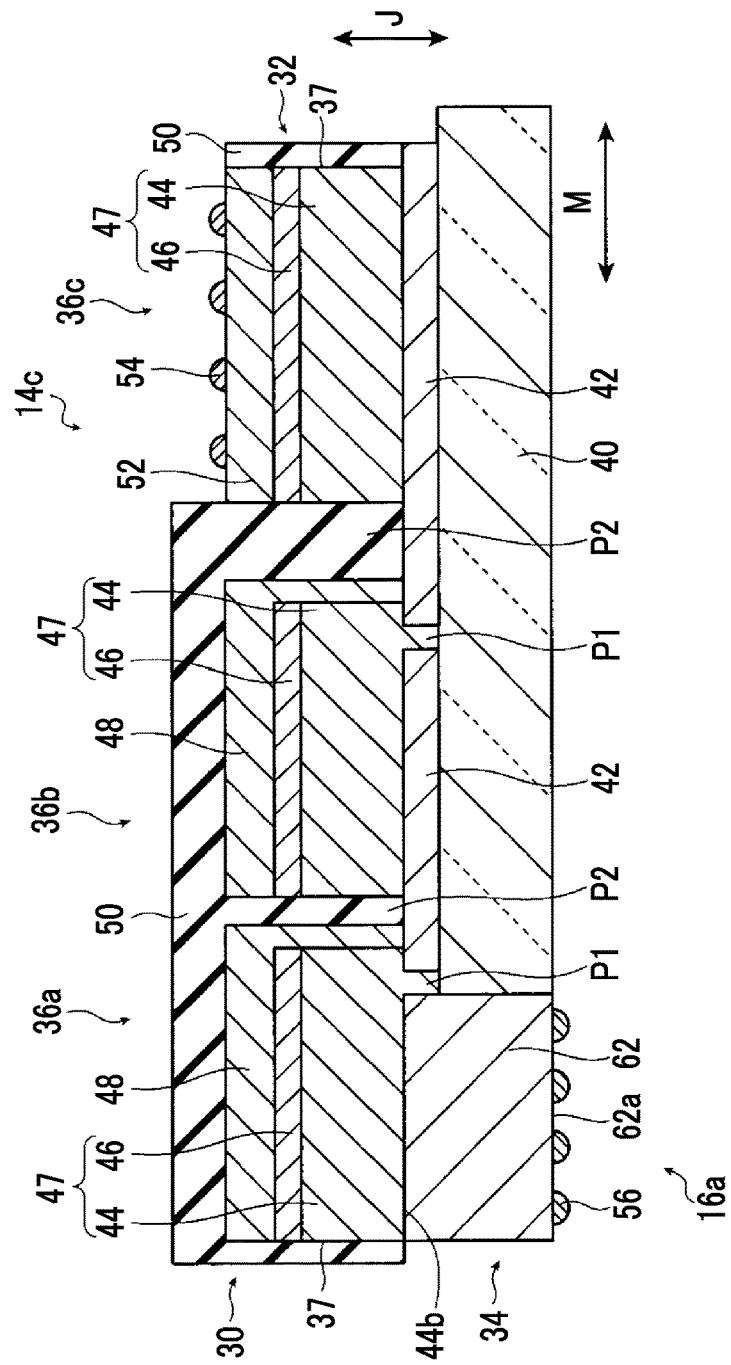
FIG. 10 is a schematic sectional view illustrating the configuration of the artificial-photosynthesis module that constitutes the artificial-photosynthesis array of the second embodiment of the invention in detail.

FIG. 8 illustrates a schematic plane view of an artificial-photosynthesis module that constitutes the artificial-photosynthesis array of the second embodiment of the invention, FIG. 9 is a schematic side view illustrating the artificial-photosynthesis module that constitutes the artificial-photosynthesis array of the second embodiment of the invention, and FIG. 10 is a schematic sectional view illustrating the configuration of the artificial-photosynthesis module that constitutes the artificial-photosynthesis array of the second embodiment of the invention in detail. FIG. 9 is a schematic side view as seen from direction $A_4$ of FIG. 8, and FIG. 10 is a sectional view taken along line C-C of FIG. 8.

Since the artificial-photosynthesis module 60 illustrated in FIGS. 8 to 10 is the same as the artificial-photosynthesis module 12 illustrated in FIGS. 3 to 5 in that, compared to the artificial-photosynthesis module 12 illustrated in FIGS. 3 to 5, the partition wall 17 is not provided, the arrangement positions of the photoelectric conversion unit 30, the hydrogen gas generating part 32, and the oxygen gas generating part 34 differ and these units are provided on the planes opposite to each other, and the oxygen gas generating part 34 differs, the detailed description thereof will be omitted.

In the artificial-photosynthesis module 60, the oxygen gas generating part 34 has a conductive film 62 provided not on the region 43 of the extending portion of the back electrode 42 but on a rear surface 44b of the photoelectric conversion layer 44 of the pn junction cell 36a, and the co-catalyst 56 for generation of oxygen is formed in the shape of lands so as to be dotted on the surface 62a of the conductive film 62. The surfaces of the hydrogen gas generating part 32 and the oxygen gas generating part 34 are provided not on the same plane but on the planes opposite to each other with respect to the insulating substrate 40.

The conductive film 62 is not particularly limited if the conductive film has conductivity, and the same material as the back electrode 42 can be used for the conductive film.

Next, a method for manufacturing the artificial-photosynthesis module 60 will be described. In addition, the method for manufacturing the artificial-photosynthesis module 60 is not limited to a manufacturing method illustrated below.

Additionally, in the method for manufacturing the artificial-photosynthesis module 60, the detailed description of the same processes as those of the method for manufacturing the artificial-photosynthesis module 12 of the first embodiment will be omitted.

In the method for manufacturing the artificial-photosynthesis module 60, since a process of forming the protective layer 50 and forming the photoelectric conversion unit 30 and a process of forming the functional layer 52 and forming the co-catalyst 54 for generation of hydrogen on the functional layer 52 are the same processes as those of the method for manufacturing the artificial-photosynthesis module 12 except for a process of first preparing a soda lime glass substrate that becomes the insulating substrate 40, and then providing the partition wall 17, the detailed description thereof will be omitted.

Thereafter, the insulating substrate 40 and the back electrode 42 at the position equivalent to the photoelectric conversion layer 44 of the pn junction cell 36a are removed, and the rear surface 44b of the photoelectric conversion layer 44 is exposed.

Thereafter, the conductive film 62 is formed on the rear surface 44b of the photoelectric conversion layer 44, for example, by the sputtering method using a patterning mask.

Thereafter, for example, a $CoO_x$ co-catalyst that becomes the co-catalyst 56 for generation of oxygen is carried in the surface 62a of the conductive film 62, for example, by the dipping method.

Then, the container 13 with almost the same size as the insulating substrate 40 is prepared, and the insulating substrate 40 in which the photoelectric conversion unit 30, the hydrogen gas generating part 32, and the oxygen gas generating part 34 are formed is housed within the container 13.

Accordingly, the electrolytic chamber 14 for hydrogen and the electrolytic chamber 16 for oxygen that are isolated from each other in the direction J are formed by the insulating substrate 40. The artificial-photosynthesis module 60 can be manufactured in this way.

In addition, the container 13 needs to have translucency in order to make the photoelectric conversion unit 30 irradiated with light. In addition, the specifications of the translucency are not particularly limited so long as the photoelectric conversion unit 30 can receive light and decompose the aqueous electrolyte solution AQ to thereby obtain hydrogen gas and oxygen gas.

Even in the artificial-photosynthesis array 10a of the present embodiment, each artificial-photosynthesis module 60 is irradiated with the light L (refer to FIG. 7), and the aqueous electrolyte solution AQ is supplied to the hydrogen gas generating part 32 and the oxygen gas generating part 34, respectively. An electromotive force is generated in the photoelectric conversion unit 30 by the irradiation of the light L (refer to FIG. 7), and the aqueous electrolyte solution AQ is decomposed in each electrolytic chamber 14 for hydrogen by the electrical energy of the photoelectric conversion unit 30, and thereby hydrogen gas is generated, is moved to the upstream side via the hydrogen gas pipe 20, and is recovered. In each electrolytic chamber 16 for oxygen, the aqueous electrolyte solution AQ is decomposed, and thereby an oxygen gas is generated, is moved to the upstream side via the oxygen gas pipe 22, and is recovered. Even in this case, since the artificial-photosynthesis module row T is inclined at the predetermined angle θ, the aqueous electrolyte solution AQ flows to the artificial-photosynthesis module 60 on the downstream side. Additionally, since the artificial-photosynthesis module row is inclined at the angle θ, the hydrogen gas and the oxygen gas are apt to move to the upstream side.

Even in the artificial-photosynthesis array 10a of the present embodiment, similar to the artificial-photosynthesis array 10 of the first embodiment, the plurality of artificial-photosynthesis modules 60 are used, and the electrolytic chamber 14 for hydrogen and the electrolytic chamber 16 for oxygen are alternately connected from upstream side in the order of the electrolytic chamber 14 for hydrogen, and the electrolytic chamber 16 for oxygen or in the order of the electrolytic chamber 16 for oxygen and the electrolytic chamber 14 for hydrogen. By connecting the electrolytic chambers in this way, gases are generated in the order of the hydrogen gas and the oxygen gas from water or in the order of the oxygen gas and the hydrogen gas from water. Accordingly, the occurrence of a difference in ion concentration or pH value in water can be suppressed, and degradation in water decomposition capability can also be suppressed. In this way, in the entire system of the artificial-photosynthesis array 10a, the ion concentration or the pH value in water can be kept constant. Moreover, it is not necessary to provide an ion exchange membrane as a partition wall.

Additionally, even in the present embodiment, similar to the first embodiment, the artificial-photosynthesis module row is inclined at the angle θ. Therefore, as described above, hydrogen gas and oxygen gas can be recovered easily.

In the artificial-photosynthesis module 12 of the first embodiment, the aqueous electrolyte solution AQ is supplied so as to become parallel to the surface (the surface 52a of the functional layer 52) in which the co-catalyst 54 for generation of hydrogen of the hydrogen gas generating part 32 is formed and the surface (the surface 43a of the region 43) in which the co-catalyst 56 for generation of oxygen of the oxygen gas generating part 34 is formed. However, the invention is not limited to this.

Figure 11A:
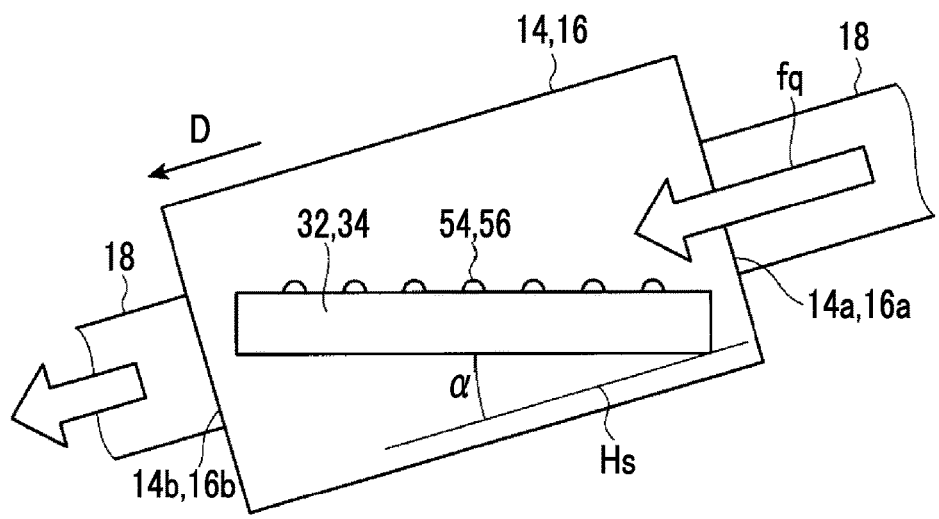
FIG. 11A is a schematic view illustrating an example of an inclined structure of a hydrogen gas generating part and an oxygen gas generating part of the artificial-photosynthesis module.

For example, as illustrated in FIG. 11A, the surface (the surface 52a of the functional layer 52) in which the co-catalyst 54 for generation of hydrogen of the hydrogen gas generating part 32 is formed and the surface (the surface 43a of the region 43) in which the co-catalyst 56 for generation of oxygen of the oxygen gas generating part 34 is formed may be inclined at a predetermined angle α with respect to a reference surface Hs such that the downstream side is raised with respect to the direction D. In this case, the insulating substrate 40 is arranged to be inclined at the angle α within the container 13. Accordingly, when a water stream fq of the aqueous electrolyte solution AQ hits the surface (the surface 52a of the functional layer 52) in which the co-catalyst 54 for generation of hydrogen of the hydrogen gas generating part 32 is formed and the surface (the surface 43a of the region 43) in which the co-catalyst 56 for generation of oxygen of the oxygen gas generating part 34 is formed, the generated gas can be removed from each surface. Accordingly, a decrease in the contact area between each surface and the aqueous electrolyte solution AQ can be suppressed, and hydrogen gas and oxygen gas can be recovered more efficiently.

Figure 11B:
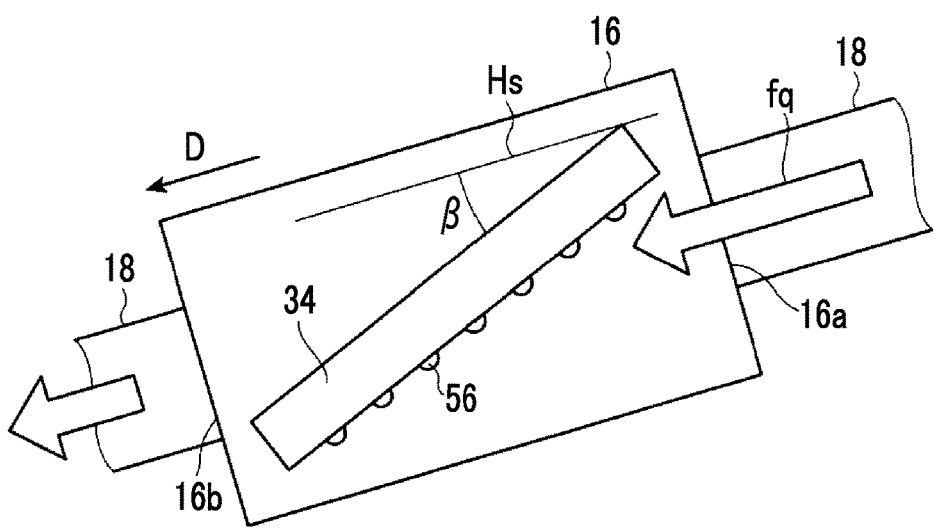
FIG. 11B is a schematic view illustrating another example of the inclined structure of the oxygen gas generating part of the artificial-photosynthesis module.

Additionally, in the artificial-photosynthesis module 60 of the second embodiment, the surfaces of the hydrogen gas generating part 32 and the oxygen gas generating part 34 are provided on the surfaces opposite to each other with respect to the insulating substrate 40 as described above. If the insulating substrate 40 is inclined at a predetermined angle β with respect to the reference surface Hs such that the downstream side is lowered with respect to the direction D, the result as illustrated in FIG. 11B is obtained. Even in this case, when the water stream hits the surface (surface 62a of the conductive film 62) in which the co-catalyst 56 for generation of oxygen of the oxygen gas generating part 34 is formed, the generated gas can be removed from the surface (the surface 62a of the conductive film 62) in which the co-catalyst 56 for generation of oxygen is formed. Accordingly, a decrease in the contact area between the surface (the surface 62a of the conductive film 62) in which the co-catalyst 56 for generation of oxygen is formed and the aqueous electrolyte solution AQ can be suppressed, and hydrogen gas and oxygen gas can be recovered more efficiently.

In the artificial-photosynthesis module 60, it is preferable to incline the surface 62a of the conductive film 62 when being inclined at the predetermined angle β. In this case, an inclined surface is formed by shaving the surface 62a of the conductive film 62 mechanically or chemically after the conductive film 62 is formed first.

The invention is basically configured as described above. Although the artificial-photosynthesis array of the invention has been described above in detail, the invention is not limited to the above embodiments, and various improvements or modifications may be made without departing from the scope of the invention.

EXPLANATION OF REFERENCES

10, 10a: artificial-photosynthesis array
12, 60: artificial-photosynthesis module
13: container
14: electrolytic chamber for hydrogen
16: electrolytic chamber for oxygen
17: partition wall
18: pipe
20: hydrogen gas pipe
22: oxygen gas pipe
30: photoelectric conversion unit
32: hydrogen gas generating part
34: oxygen gas generating part
36a, 36b, 36c: pn junction cell
40: insulating substrate
42: back electrode
44: photoelectric conversion layer
46: buffer layer
48: transparent electrode
50: protective layer
52: functional layer
54, 56: co-catalyst
62: conductive film

What is claimed is:

1. An artificial-photosynthesis array comprising:
   a plurality of artificial-photosynthesis modules wherein each module comprises:
   a hydrogen gas generating part that generates hydrogen gas from an aqueous electrolyte solution;
   an oxygen gas generating part that generates oxygen gas from the aqueous electrolyte solution;
   a photoelectric conversion unit for supplying electrical energy from light and supplying electrical energy for generating the hydrogen gas in the hydrogen gas generating part and electrical energy for generating the oxygen gas in the oxygen gas generating part,
   the hydrogen gas generating part, the oxygen gas generating part, the photoelectric conversion unit each being provided on a plane and being electrically connected together;
   an electrolytic chamber for hydrogen that contains the hydrogen gas generating part, the supplied aqueous electrolyte solution, and the generated hydrogen gas; and
   an electrolytic chamber for oxygen that contains the oxygen gas generating part, the supplied aqueous electrolyte solution, and the generated oxygen gas,
   wherein the electrolytic chamber for hydrogen and the electrolytic chamber for oxygen include a plurality of artificial-photosynthesis modules that are isolated from each other so that the generated hydrogen gas and the generated oxygen gas do not mix with each other,
   wherein the electrolytic chamber for hydrogen is connected to the electrolytic chamber for oxygen of another artificial-photosynthesis module adjacent thereto, and the electrolytic chamber for oxygen is connected to the electrolytic chamber for hydrogen of another artificial-photosynthesis module adjacent thereto,
   wherein the artificial-photosynthesis module is inclined in a direction in which the hydrogen gas generating part and the oxygen gas generating part of another artificial-photosynthesis module are lined up,
   wherein the aqueous electrolyte solution is supplied to the electrolytic chamber for hydrogen and the electrolytic chamber for oxygen of each of the artificial-photosynthesis modules at a predetermined flow rate, and
   wherein two flows of the supplied aqueous electrolyte solution are passed through the electrolytic chamber for hydrogen and the electrolytic chamber for oxygen of each of the artificial-photosynthesis modules.

2. The artificial-photosynthesis array according to claim 1,
   wherein the hydrogen gas generating part and the oxygen gas generating part are provided on the same plane.

3. The artificial-photosynthesis arrays according to claim 2,
wherein the hydrogen gas generating part and the oxygen gas generating part are arranged to be inclined with respect to the flow of the supplied aqueous electrolyte solution.

4. The artificial-photosynthesis arrays according to claim 2,
wherein a plurality of photoelectric conversion elements of the photoelectric conversion unit are connected in series.

5. The artificial-photosynthesis array according to claim 2,
wherein the hydrogen gas generating part is covered with a functional layer, and the functional layer is insoluble in a weak acidic solution and a weak alkaline solution, and has all of light permeability, water impermeability, and conductivity.

6. The artificial-photosynthesis array according to claim 2,
wherein the photoelectric conversion unit is covered with a protective layer, and the protective layer is insoluble in a weak acidic solution and a weak alkaline solution, and has all of light permeability, water impermeability, and insulation.

7. The artificial-photosynthesis array according to claim 1,
wherein the hydrogen gas generating part and the oxygen gas generating part are provided on mutually different planes.

8. The artificial-photosynthesis arrays according to claim 7,
wherein the hydrogen gas generating part and the oxygen gas generating part are arranged to be inclined with respect to the flow of the supplied aqueous electrolyte solution.

9. The artificial-photosynthesis arrays according to claim 7,
wherein a plurality of photoelectric conversion elements of the photoelectric conversion unit are connected in series.

10. The artificial-photosynthesis array according to claim 7,
wherein the hydrogen gas generating part is covered with a functional layer, and the functional layer is insoluble in a weak acidic solution and a weak alkaline solution, and has all of light permeability, water impermeability, and conductivity.

11. The artificial-photosynthesis array according to claim 7,
wherein the photoelectric conversion unit is covered with a protective layer, and the protective layer is insoluble in a weak acidic solution and a weak alkaline solution, and has all of light permeability, water impermeability, and insulation.

12. The artificial-photosynthesis arrays according to claim 1,
wherein the hydrogen gas generating part and the oxygen gas generating part are arranged to be inclined with respect to the flow of the supplied aqueous electrolyte solution.

13. The artificial-photosynthesis array according to claim 12,
wherein the hydrogen gas generating part is covered with a functional layer, and the functional layer is insoluble in a weak acidic solution and a weak alkaline solution, and has all of light permeability, water impermeability, and conductivity.

14. The artificial-photosynthesis arrays according to claim 1,
wherein a plurality of photoelectric conversion elements of the photoelectric conversion unit are connected in series.

15. The artificial-photosynthesis array according to claim 14,
wherein each of the photoelectric conversion elements includes an inorganic semiconductor film having a pn junction.

16. The artificial-photosynthesis array according to claim 15,
wherein the inorganic semiconductor film includes a CIGS compound semiconductor.

17. The artificial-photosynthesis array according to claim 15,
wherein the inorganic semiconductor film includes a CZTS compound semiconductor.

18. The artificial-photosynthesis array according to claim 1,
wherein the hydrogen gas generating part is covered with a functional layer, and the functional layer is insoluble in a weak acidic solution and a weak alkaline solution, and has all of light permeability, water impermeability, and conductivity.

19. The artificial-photosynthesis array according to claim 18,
wherein the functional layer has a co-catalyst provided on the surface thereof, and the co-catalyst is made of Pt, a substance containing Pt, or Rh.

20. The artificial-photosynthesis array according to claim 1,
wherein the photoelectric conversion unit is covered with a protective layer, and the protective layer is insoluble in a weak acidic solution and a weak alkaline solution, and has all of light permeability, water impermeability, and insulation.

* * * * *